US006645805B2

United States Patent
Kil

(10) Patent No.: US 6,645,805 B2
(45) Date of Patent: Nov. 11, 2003

(54) METHOD FOR FORMING DIELECTRIC FILM OF CAPACITOR

(75) Inventor: Deok Sin Kil, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,271

(22) Filed: Dec. 30, 2002

(65) Prior Publication Data

US 2003/0124875 A1 Jul. 3, 2003

(30) Foreign Application Priority Data

Dec. 31, 2001 (KR) ........................................ 2001-89192

(51) Int. Cl.[7] ........................................ H01L 21/8242
(52) U.S. Cl. ............................. 438/240; 438/381; 438/3
(58) Field of Search .................... 438/238–256, 438/381–399, 3

(56) References Cited

U.S. PATENT DOCUMENTS 5,499,207 A * 3/1996 Miki et al. .................. 365/149
6,287,965 B1 9/2001 Kang et al.
6,391,803 B1 5/2002 Kim et al.
6,403,156 B2 6/2002 Jang et al.

* cited by examiner

Primary Examiner—Jey Tsai
(74) Attorney, Agent, or Firm—Marshall, Gerstein & Borun LLP

(57) ABSTRACT

A method for forming a dielectric film of a capacitor includes injecting a first source containing a first component into a reaction chamber to be adsorbed on a surface of a substrate, purging residual first source out of the reaction chamber, injecting a mixed gas of Ar and $O_2$ in plasma state into the reaction chamber to react with the first component adsorbed on the substrate, purging by-products and residual gas out of the reaction chamber, injecting a second source containing a second component into the reaction chamber to be adsorbed to the surface of the resulting structure, purging residual second source out of the reaction chamber, injecting a mixed gas of Ar and $O_2$ in plasma state into the reaction chamber to induce oxidation reaction and purging residual gas and by-products out of the reaction chamber using mixed gas of Ar and $O_2$ for obtaining sufficient capacitance for highly integrated semiconductor devices.

20 Claims, 2 Drawing Sheets

METHOD FOR FORMING DIELECTRIC FILM OF CAPACITOR

BACKGROUND

1. Technical Field

Methods for forming dielectric films of capacitors are disclosed wherein a high K oxide monoatomic layer having a high dielectric constant such as $SrTiO_3$ and $(Ba,Sr)TiO_3$ is formed by using an atomic layer deposition having high step coverage to provide sufficient capacitance for high integration of the semiconductor device in case of a capacitor having a high aspect ratio and a geometrically-complicated structure.

2. Description of the Related Art

As the size of a cell decreases due to high integration density, it becomes more difficult to obtain sufficient capacitance which is proportional to the surface area of a storage node.

In particular, in the DRAM wherein a unit cell includes a MOS transistor and a capacitor, a capacitance of the capacitor needs to be increased and an area occupied by the capacitor needs to be decreased to achieve high integration.

Therefore, in order to increase the capacitance of the capacitor which follows the equation $(Eo \times Er \times A)/T$ (where Eo denotes a vacuum dielectric constant, Er denotes a dielectric constant of a dielectric film, A denotes an area of the capacitor and T denotes a thickness of the dielectric film), a method of increasing a surface area of a storage node which is a lower electrode has been proposed.

However, the method for increasing the surface area of the storage node has reached a limit due to the high integration density and process limitations of the semiconductor device.

Recently, a method for forming a capacitor using a dielectric film having a high dielectric constant has been proposed to obtain sufficient capacitance for highly integrated semiconductor devices.

The dielectric film having a high dielectric constant is deposited on the surface of the storage node having a large step difference according to atomic layer deposition. However, when atomic layer deposition is performed to form a dielectric layer from at least two source materials, the composition of the dielectric layer becomes very difficult to control.

A method for controlling the composition of dielectric layers by varying a feed ratio of each source material has been suggested. However, precise control of the feed ratio is almost impossible since the feed ratio is a multiple of the intrinsic deposition rate of each source material.

FIG. 1 is a graph showing a conventional method for controlling the composition of a dielectric layer formed from two source materials and a reaction gas using atomic layer deposition, wherein general variations in the deposition rate relative to the flow rate of the reaction gas is illustrated.

Since the atomic layer deposition is based on adsorption reaction on the surface of a substrate, the deposition rate saturates to a predetermined value when flow rate of the reaction gas reaches a predetermined value.

Here, a and b of FIG. 1 which are the deposition rates at saturation have specific values according to each source material and reaction gas.

In addition, when chemical properties of the source materials and the reaction gas are determined, critical values of the source gas and the reaction gas are fixed to one value to obtain the saturated deposition rate a or b.

Accordingly, when the oxide thin film composed of a material having at least two components is formed according to the atomic layer deposition, a complicated process results wherein the feeding ratio of each source is varied as required to form the oxide thin film having stoichiometric compositions with the saturated deposition rate.

SUMMARY OF THE DISCLOSURE

Accordingly, a method for forming a dielectric film of a capacitor is disclosed which has sufficient capacitance for highly integrated semiconductor devices by forming a dielectric film having a high dielectric constant using atomic layer deposition with excellent step coverage.

One disclosed method for forming a multi-component dielectric film comprises: (a) injecting a first source containing a first component into a reaction chamber to be adsorbed on a surface of a substrate; (b) purging residual first source out of the reaction chamber; (c) injecting a mixed gas of Ar and $O_2$ in plasma state into the reaction chamber to react with the first component adsorbed on the substrate; (d) purging by-products and residual gas out of the reaction chamber; (e) injecting a second source containing a second component into the reaction chamber to be adsorbed to the surface of the resulting structure; (f) purging residual second source out of the reaction chamber; (g) injecting a mixed gas of Ar and $O_2$ in plasma state into the reaction chamber to induce oxidation reaction; and (h) purging residual gas and by-products out of the reaction chamber using mixed gas of Ar and $O_2$, wherein the substrate is selected from the group consisting of Si, $SiO_2$, TiN, TiSiN, TiAlN, Ru, Pt, Ir, $RuO_2$, $IrO_2$, and combinations thereof; the purge processes of step (b), (d), (f) and (h) are performed using a vacuum pump; the purge processes of step (b), (d), (f) and (h) are performed using a vacuum pump with an inert gas added thereto; the method further comprises a step of injecting $O_2$ gas into the reaction chamber for 0.1 to 10 seconds during the step (c) and (g), respectively; step (c) and (g) is performed on the condition of maintaining the reaction chamber at a pressure ranges from 0.5 to 5.0 Torr; the $O_2$ gas ratio of the mixed gas of Ar and $O_2$ in plasma state is 20 to 40% in the step (c) and (g), respectively; mixed gas of Ar and $O_2$ in plasma state is generated in the reaction chamber or a remotely generated out of the chamber and then supplied into the reaction chamber; during the step (a) to (h) the substrate is maintained at a temperature ranging from 150 to 300° C. and the first source and the second source are injected for a time period ranging from 0.1 to 10 seconds; one of the first source and the second source is Sr and the other is Ti; the Sr source is selected from the group consisting of $Sr(THD)_2$, $Sr(METHD)_2$, and solutions thereof; the Ti source is selected from the group consisting of $Ti(i\text{-}OC_3H_7)_4$, $Ti(n\text{-}OC_4H_9)_4$, $Ti(t\text{-}OC_4H_7)_4$, $Ti(OC_2H_5)_4$, $Ti(OCH_3)_4$, $Ti(n\text{-}OC_3H_7)_4$ and combinations thereof; the Sr source and the Ti source are injected for a time period ranging from 0.1 to 10 seconds in the processes (a) and (e), respectively; the purge processes of step (b), (d), (f) and (h) are performed using a vacuum pump; the purge processes of step (b), (d), (f) and (h) are performed using a vacuum pump with an inert gas added thereto; the step (c) and (g) is performed on the condition of: maintaining the pressure of the reaction chamber ranging from 0.5 to 5.0 Torr; injecting $O_2$ for a time period ranging from 0.1 to 10 seconds; and injecting a mixed gas of Ar and $O_2$; the mixed gas of Ar and $O_2$ in plasma state is generated in the reaction chamber or a remotely generated and then supplied into the reaction chamber; the $O_2$ gas ratio of the mixed gas of Ar and $O_2$ in plasma state is 20 to 40%; the substrate is maintained at a temperature ranging from 150 to 300° C. and the first source and the second source are injected for a time period ranging from 0.1 to 10 seconds in the step (a) to (h), respectively; and the first source is a cocktail source of Sr/Ti and the second source is Ti source.

The principles of the disclosed methods will now be explained.

The disclosed method controls compositions of dielectric layers by using differences of reaction rates between reaction gas and each source material while using conventional atomic layer deposition having a surface chemical reaction property of a monoatomic layer.

For example, when SrTiO thin film is formed according to atomic layer deposition using Sr source and Ti source, $Ar/O_2$ mixed gas is activated in a remote plasma device and injected into a reaction chamber as an oxidation source, which allow precise control of compositions of $SrTiO_3$ thin film without changing a feeding ratio of Si source and Ti source which are absorbed by using oxidation reaction differences between each source and $Ar/O_2$.

Here, Sr source is selected from the group consisting of β-Diketonate group Ligand containing $Sr(THD)_2$ or $Sr(METHD)_2$, solutions thereof, and Ti source is an alkoxide group material selected from the group consisting of $Ti(i-OC_3H_7)_4$, $Ti(n-OC_4H_9)_4$, $Ti(t-OC_4H_7)_4$, $Ti(OC_2H_5)_4$, $Ti(OCH_3)_4$, $Ti(n-OC_3H_7)_4$ and combinations thereof.

BRIEF DESCRIPTION OF THE DRAWINGS

The disclosed techniques will become better understood with reference to the accompanying drawings which are given only by way of illustration. In the drawings.

DETAILED DESCRIPTION OF THE PRESENTLY PREFERRED EMBODIMENTS

A method for forming a dielectric film of capacitor in accordance with a preferred embodiment will now be described in detail with reference to the accompanying drawings.

Figure 1:
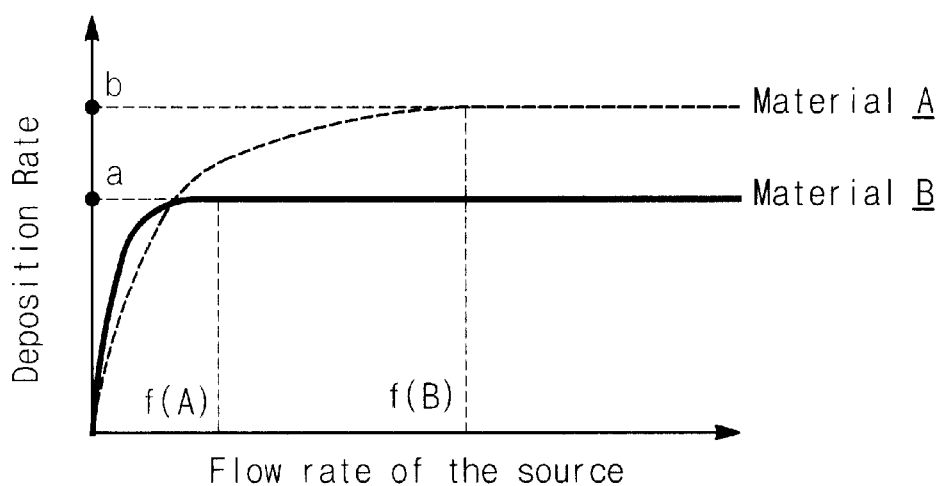
FIG. 1 is a graph showing a conventional method for controlling compositions of ternary compounds according to atomic layer deposition.
Figure 2:
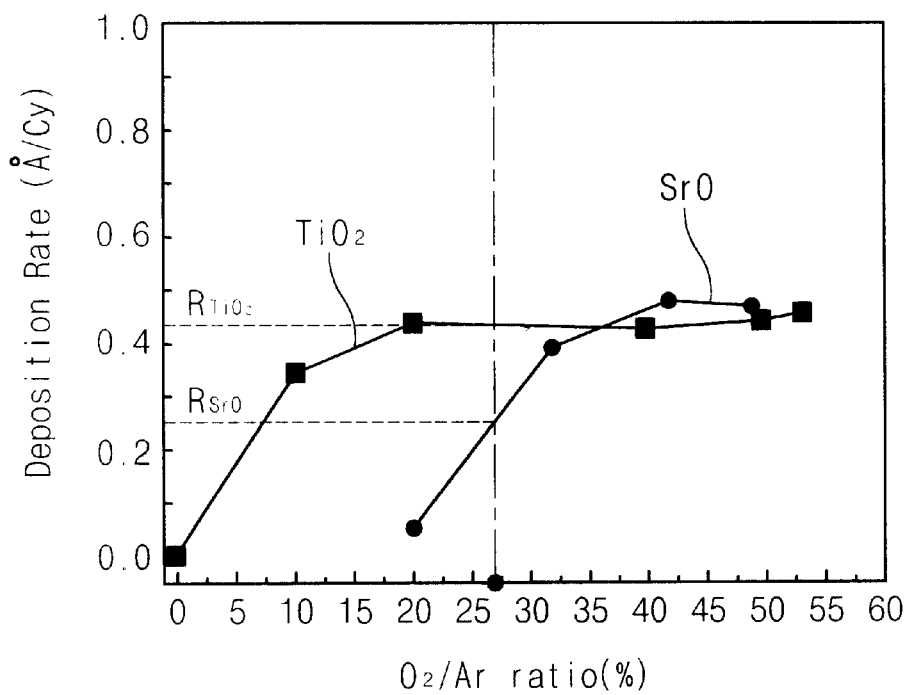
FIG. 2 is a graph showing a deposition rate according to $Ar/O_2$ ratio in atomic layer deposition of $SrTiO_3$.

FIG. 2 is a graph showing a deposition rate according to $Ar/O_2$ ratio in atomic layer deposition of $SrTiO_3$. When ratio of $O_2$ is increased, the deposition rate increases and saturates to a predetermined value. Here, deposition rates of $TiO_2$ and SrO varies greatly according to the ratio of $O_2$.

As shown in FIG. 2, $O_2$ reacts with adsorbed Ti source and thus the deposition rate reaches a saturation value when ratio of $O_2$ is over 10% in the case of $TiO_2$, while the deposition rate is gradually increased to a predetermined value when ratio of $O_2$ is over 20% in the case of SrO.

That is, the deposition rate of $TiO_2$ is an almost constant value when ratio of $O_2$ is 20 to 40%, while the deposition rate of SrO shows gradual increase.

The difference in deposition rate between $TiO_2$ and SrO shows that Sr/Ti compositions can be precisely controlled by adjusting $O_2$ ratio for oxidation of adsorbed Sr and Ti between 20 and 40%.

Figure 3:
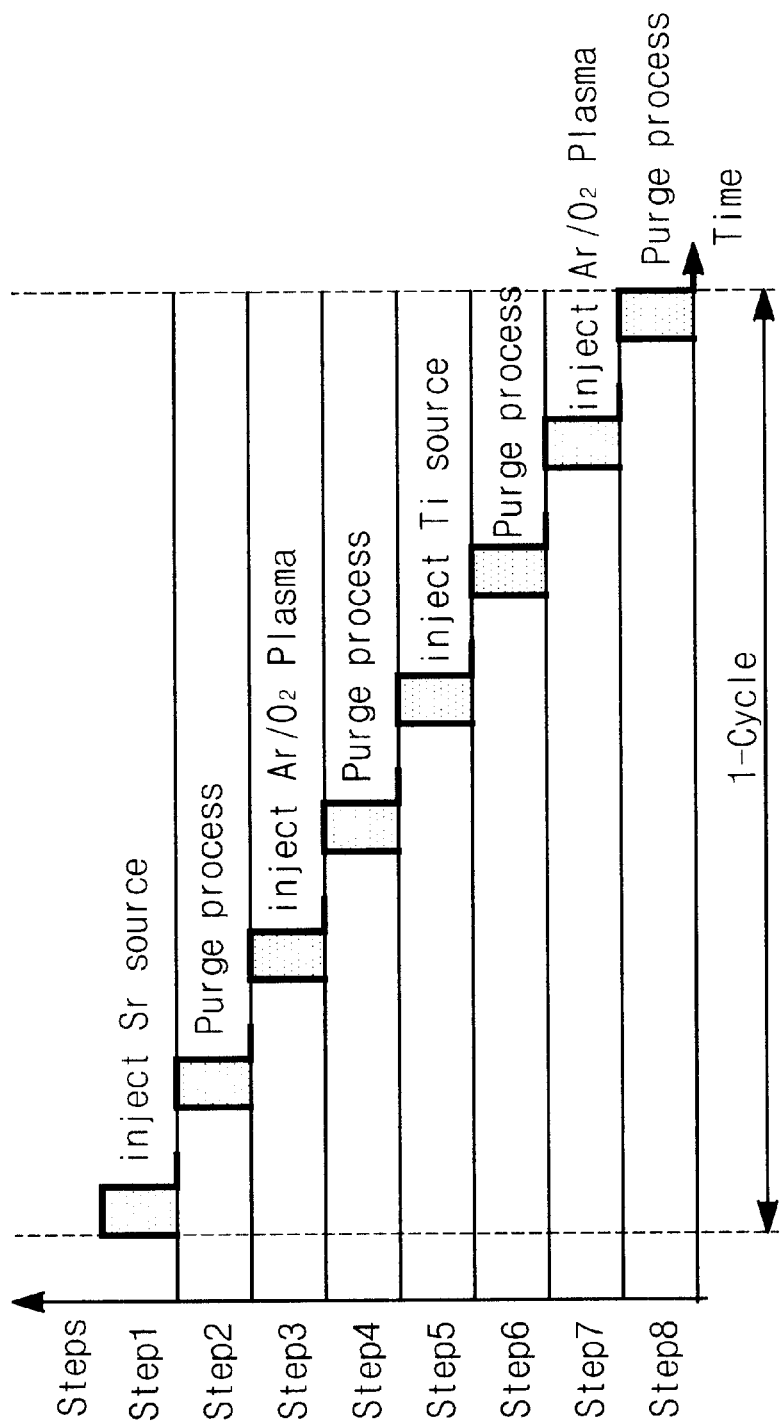
FIG. 3 is a graph showing a process for forming $SrTiO_3$ thin film having a high dielectric constant in accordance with the disclosed method.

FIG. 3 is a graph showing the method for forming the capacitor of the semiconductor device in accordance with the disclosed methods, wherein one cycle of atomic layer deposition for forming $SrTiO_3$ thin film is shown.

Step 1:

As depicted in FIG. 3, Sr (or Ti) source is injected into a reaction chamber to induce surface adsorption reaction of the source material to a substrate.

Preferably, Sr source is $Sr(THD)_2$ or $Sr(METHD)_2$ which contains β-Diketonate family Ligand, and Ti source is $Ti(OiPr)_4$ of alkoxide group, $Ti(i-OC_3H_7)_4$, $Ti(n-OC_4H_9)_4$, $Ti(t-OC_4H_7)_4$, $Ti(OC_2H_5)_4$, $Ti(OCH_3)_4$, $Ti(n-OC_3H_7)_4$ or combinations thereof.

In the same manner, sources containing β-Diketonate family Ligand may be used as Sr sources, and sources of alkoxide group may be used as Ti sources.

In addition, the substrate is preferably selected from the group consisting of Si, $SiO_2$, TiN, TiSiN, TiAlN, Ru, Pt, Ir, $RuO_2$, $IrO_2$, and combinations thereof.

Step 2:

The residual source gas is purged out of the reaction chamber using Ar or $N_2$. Here, the purge process is preferably performed using a vacuum pump. An inert gas can be added thereto.

Step 3:

$Ar/O_2$ plasma gas having a predetermined $Ar/O_2$ ratio for controlling Sr/Ti compositions is injected into the reaction chamber so that the injected $Ar/O_2$ gas reacts with the Sr (or Ti) source absorbed to the substrate to form SrO or $Ar/O_2$ monoatomic layer. Here, the reaction chamber is preferably maintained at a pressure of 0.5 to 5.0 Torr, and $O_2$ gas may be supplied into the chamber for 0.1 to 10 seconds during the injection of $Ar/O_2$ plasma gas.

In addition, $Ar/O_2$ plasma gas may be generated in the reaction chamber or remotely generated and supplied into the reaction chamber.

Step 4:

The Reaction by-products generated from the oxidation reaction and residual $Ar/O_2$ plama gas are purged out of the reaction chamber. Here, the purge process is preferably performed using a vacuum pump. An inert gas can be added thereto.

Step 5:

Ti source, or Sr source when Ti source is used in step 1, is supplied to the reaction chamber to induce adsorption reaction.

Step 6:

The residual gas is purged out of the reaction chamber. Here, the purge process is preferably performed using a vacuum pump. An inert gas can be added thereto.

Step 7:

$Ar/O_2$ plasma gas activated preferably in a remote plasma device having a predetermined $Ar/O_2$ ratio for oxidation reaction is injected into the reaction chamber, and the reaction chamber is maintained preferably at a pressure ranging from 0.5 to 5.0 Torr, thereby inducing the oxidation reaction. Here, when plasma type $Ar/O_2$ mixed gas is put into the reaction chamber, $O_2$ can be supplied for 0.1 to 10 seconds. Preferably, the $Ar/O_2$ plasma gas is a plasma generated in the reaction chamber or a remotely generated plasma to be supplied to the reaction chamber.

Step 8:

The residual gas and reaction by-products are purged out of the reaction chamber using $Ar/O_2$. Here, the purge process is preferably performed using a vacuum pump. An inert gas can be added thereto.

Preferably, the substrate may be maintained at a temperature ranging from 150 to 300° C. and Ti source and Sr source may be supplied for a time period ranging from 0.1 to 10 seconds during the step 1 to step 8.

One $SrTiO_3$ layer can be formed by performing the step 1 to step 8, and $SrTiO_3$ layer having a desired thickness can be formed by repeating these steps.

Ratio of Sr to Ti in the $SrTiO_3$ layer formed on the substrate is equal to the ratio of the deposition rate of $TiO_2$ to the deposition rate of SrO corresponding to a specific $Ar/O_2$ ratio, i.e. when ratio of Ar to $O_2$ is $F_{O2}$, the ratio of Sr to Ti is $R_{SrO}/R_{TiO2}$ as shown in FIG. 2. Thus, ratio of Sr to Ti can be precisely controlled without varing the injection rate of Sr and Ti sources according to the method of the present invention.

Here, the property of the atomic layer deposition of $SrTiO_3$ film is improved when the difference of the reaction characteristics to $Ar/O_2$ plasma between source gases is larger.

In another embodiment, BST thin film such as (Ba,Sr)$TiO_3$ can be formed by using Sr/Ti cocktail source instead of using Sr source.

As discussed earlier, in the disclosed methods for forming capacitors, the compositions of an oxide film having at least two components can be precisely controlled to form the high dielectric constant oxide film according to the atomic layer deposition, thereby obtaining sufficient capacitance for the high integration of the semiconductor device.

As the disclosed techniques may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a multi-component dielectric film for a capacitor comprising:
   (a) injecting a first source containing a first component into a reaction chamber to be adsorbed on a surface of a substrate;
   (b) purging residual first source out of the reaction chamber;
   (c) injecting a mixed gas of Ar and $O_2$ in plasma state into the reaction chamber to react with the first component adsorbed on the substrate;
   (d) purging by-products and residual gas out of the reaction chamber;
   (e) injecting a second source containing a second component into the reaction chamber to be adsorbed to the surface of the resulting structure;
   (f) purging residual second source out of the reaction chamber;
   (g) injecting a mixed gas of Ar and $O_2$ in plasma state into the reaction chamber to induce oxidation reaction; and
   (h) purging residual gas and by-products out of the reaction chamber using mixed gas of Ar and $O_2$.

2. The method according to claim 1, wherein the substrate is selected from the group consisting of Si, $SiO_2$, TiN, TiSiN, TiAlN, Ru, Pt, Ir, $RuO_2$, $IrO_2$, and combinations thereof.

3. The method according to claim 1, wherein the purge processes of step (b), (d), (f) and (h) are performed using a vacuum pump.

4. The method according to claim 1, wherein the purge processes of step (b), (d), (f) and (h) are performed using a vacuum pump with an inert gas added thereto.

5. The method according to claim 1, further comprising a step of injecting $O_2$ gas into the reaction chamber for a time period ranging from 0.1 to 10 seconds during the step (c) and (g), respectively.

6. The method according to claim 1, wherein step (c) and (g) is performed on the condition of maintaining the reaction chamber at a pressure ranges from 0.5 to 5.0 Torr.

7. The method according to claim 1, wherein the $O_2$ gas ratio of the mixed gas of Ar and $O_2$ in plasma state is 20 to 40% in the step (c) and (g), respectively.

8. The method according to claim 1, wherein mixed gas of Ar and $O_2$ in plasma state is generated in the reaction chamber or a remotely generated out of the chamber and then supplied into the reaction chamber.

9. The method according to claim 1, wherein during the step (a) to (h) the substrate is maintained at a temperature ranging from 150 to 300° C. and the first source and the second source are injected for a time period ranging from 0.1 to 10 seconds.

10. The method according to claim 1, wherein one of the first source and the second source is Sr and the other is Ti.

11. The method according to claim 10, wherein the Sr source is selected from the group consisting of $Sr(THD)_2$, $Sr(METHD)_2$, and solutions thereof.

12. The method according to claim 10, wherein the Ti source is selected from the group consisting of $Ti(i-OC_3H_7)_4$, $Ti(n-OC_4H_9)_4$, $Ti(t-OC_4H_7)_4$, $Ti(OC_2H_5)_4$, $Ti(OCH_3)_4$, $Ti(n-OC_3H_7)_4$ and combinations thereof.

13. The method according to claim 10, wherein the Sr source and the Ti source are injected for a time period ranging from 0.1 to 10 seconds in the processes (a) and (e), respectively.

14. The method according to claim 10, wherein the purge processes of step (b), (d), (f) and (h) are performed using a vacuum pump.

15. The method according to claim 10, wherein the purge processes of step (b), (d), (f) and (h) are performed using a vacuum pump with an inert gas added thereto.

16. The method according to claim 10, wherein the step (c) and (g) is performed on the condition of: maintaining the pressure of the reaction chamber ranging from 0.5 to 5.0 Torr; injecting $O_2$ for a time period ranging from 0.1 to 10 seconds; and injecting a mixed gas of Ar and $O_2$.

17. The method according to claim 10, wherein the mixed gas of Ar and $O_2$ in plasma state is generated in the reaction chamber or a remotely generated and then supplied into the reaction chamber.

18. The method according to claim 10, wherein the $O_2$ gas ratio of the mixed gas of Ar and $O_2$ in plasma state is 20 to 40%.

19. The method according to claim 10, wherein the substrate is maintained at a temperature ranging from 150 to 300° C. and the first source and the second source are injected for a time period ranging from 0.1 to 10 seconds in the step (a) to (h), respectively.

20. The method according to claim 1, wherein the first source is a cocktail source of Sr/Ti and the second source is Ti source.

* * * * *

UNITED STATES PATENT AND TRADEMARK OFFICE
CERTIFICATE OF CORRECTION

PATENT NO.    : 6,645,805 B2
DATED         : November 11, 2003
INVENTOR(S)   : Deok-Sin Kil It is certified that error appears in the above-identified patent and that said Letters Patent is hereby corrected as shown below:

<u>Title page,</u>
Item [75], Inventor, after "Deok Sin Kil," please delete "Ichon-shi" and insert
-- Kyoungki-do -- in its place.

Signed and Sealed this

Ninth Day of March, 2004

JON W. DUDAS
*Acting Director of the United States Patent and Trademark Office*